(12) United States Patent
Shima et al.

(10) Patent No.: US 8,957,351 B2
(45) Date of Patent: Feb. 17, 2015

(54) CATALYTIC CVD EQUIPMENT, METHOD FOR FORMATION OF FILM, PROCESS FOR PRODUCTION OF SOLAR CELL, AND SUBSTRATE HOLDER

(75) Inventors: Masaki Shima, Uji (JP); Yoshinori Wakamiya, Sumoto (JP); Shuji Osono, Sammu (JP); Satohiro Okayama, Chigasaki (JP); Hideyuki Ogata, Chigasaki (JP)

(73) Assignees: SANYO Electric Co., Ltd., Moriguchi-shi (JP); ULVAC, Inc., Chigasaki-shi (JP)

( * ) Notice: Subject to any disclaimer, the term of this patent is extended or adjusted under 35 U.S.C. 154(b) by 0 days.

(21) Appl. No.: 13/435,646

(22) Filed: Mar. 30, 2012

(65) Prior Publication Data
US 2012/0190149 A1    Jul. 26, 2012

Related U.S. Application Data

(63) Continuation of application No. PCT/JP2010/067285, filed on Oct. 1, 2010.

(30) Foreign Application Priority Data

Oct. 2, 2009   (JP) .................... 2009-230589

(51) Int. Cl.
*H05B 3/68*    (2006.01)
*C23C 16/44*   (2006.01)
*C23C 16/24*   (2006.01)
*H01L 21/687*  (2006.01)

(52) U.S. Cl.
CPC .............. *C23C 16/44* (2013.01); *C23C 16/24* (2013.01); *H01L 21/68757* (2013.01)
USPC ........................................ 219/444.1

(58) Field of Classification Search
USPC .................... 219/444.1, 385, 443.1
See application file for complete search history.

(56) References Cited

U.S. PATENT DOCUMENTS

| | | | | |
|---|---|---|---|---|
| 6,120,660 A | * | 9/2000 | Chu et al. | 204/298.15 |
| 2001/0025649 A1 | * | 10/2001 | Wada | 136/249 |
| 2002/0104477 A1 | | 8/2002 | Yamoto et al. | |
| 2004/0219315 A1 | * | 11/2004 | Bryden | 428/34.4 |

FOREIGN PATENT DOCUMENTS

| | | | |
|---|---|---|---|
| JP | 2002151422 A | 5/2002 | |
| JP | 2005327995 A | 11/2005 | |
| JP | 2008095132 A | 4/2008 | |
| JP | 2008300793 A | 12/2008 | |

OTHER PUBLICATIONS

"Opposed, adj." OED Online. Oxford University Press, Jun. 2014. Web. Jun. 16, 2014.*

* cited by examiner

*Primary Examiner* — Reema Patel
(74) *Attorney, Agent, or Firm* — Marvin A. Motsenbocker; Mots Law, PLLC

(57) ABSTRACT

In a catalytic CVD equipment, a holder includes an antireflective structure for preventing reflection of a radiant ray that is ejected from the catalytic wire toward the side of the substrate.

8 Claims, 6 Drawing Sheets

CATALYTIC CVD EQUIPMENT, METHOD FOR FORMATION OF FILM, PROCESS FOR PRODUCTION OF SOLAR CELL, AND SUBSTRATE HOLDER

CROSS REFERENCE

This application is a Continuation of PCT Application No. PCT/JP2010/067285 filed on Oct. 1, 2010, and claims the priority of Japanese Patent Application No. 2009-230589 filed on Oct. 2, 2009, the content of both of which is incorporated herein by reference.

TECHNICAL FIELD

The present invention relates to a catalytic CVD equipment which is employed in a catalytic CVD technique, a method for formation of film, a process for production of solar cell, and a substrate holder.

BACKGROUND ART

As a method for forming a predetermined deposited film on a substrate at the time of producing a variety of semiconductor devices such as solar cells, in general, a CVD technique (a Chemical Vapor Deposition technique) is conventionally known. As one kind of such CVD technique, in recent years, a catalytic CVD technique utilizing Catalytic Chemical Vapor Deposition has been discussed (Patent Document 1, for example).

In the catalytic CVD technique, a raw material gas to be supplied into a reaction chamber is decomposed by employing a catalytic wire that is made of heated tungsten, molybdenum or the like and then a deposited film is formed on a substrate that is held on a holder. The catalytic CVD technique is expected as a method for formation of film, by which a substrate surface or a deposited film surface is less adversely affected, since such plasma discharge in a plasma CVD technique is not utilized.

PRIOR ART DOCUMENT(S)

Patent Document

Patent Document 1: Japanese Unexamined Patent Application Publication No. 2005-327995

SUMMARY OF THE INVENTION

In the abovementioned catalytic CVD technique, a catalytic wire is heated up to the order of about 1,600 degrees Centigrade to 2,000 degrees Centigrade. In this duration, a radiant ray (such as an infrared ray or a visible ray, for example) is ejected from the catalytic wire, and a substrate absorbs the radiant ray by itself, and is thereby heated.

At this time, the substrate is easily overheated up to a temperature which is higher than a preferred temperature to form a quality film by absorbing the radiant ray that passes through the substrate and then is reflected by means of the holder. If a film is deposited on the substrate in such a state, the film quality of the deposited film may be degraded. In addition, such a problem does not occur with only a semiconductor device, but can generally occur in a case where a deposited film is formed by means of the catalytic CVD technique.

The present invention has been made in view of the above-described circumstance, and it is an object of the present invention to provide a catalytic CVD equipment, a method for formation of film, a process for production of solar cell, and a substrate holder that are capable of restraining overheating of a substrate.

A catalytic CVD equipment according to the present invention, is summarized as a catalytic CVD equipment for performing formation of film by supplying a raw material gas to a catalytic wire that is installed and heated in a reaction chamber and then depositing generated decomposed species on a substrate that is held on a holder in the reaction chamber, the holder including an antireflective structure for preventing reflection of a radiant ray that is ejected from the catalytic wire.

In a catalytic CVD equipment according to the present invention, the antireflective structure may include an antireflective film.

In a catalytic CVD equipment according to the present invention, the antireflective film may include a silicon-containing film.

In a catalytic CVD equipment according to the present invention, the silicon-containing film may have at least one structure of an amorphous structure and a crystalline structure.

In a catalytic CVD equipment according to the present invention, the antireflective film may include a mixed crystal film.

In a catalytic CVD equipment according to the present invention, the antireflective structure may have a concave-convex structure that is provided so as to be opposed to the substrate.

A catalytic CVD equipment according to the present invention is summarized as a catalytic CVD equipment for performing formation of film by supplying a raw material gas to a catalytic wire that is instated and heated in a reaction chamber and then depositing generated decomposed species on a substrate that is held on a holder in the reaction chamber, the holder including a silicon-containing film that is formed on a holding face for holding the substrate.

A method of formation of a film according to the present invention is summarized as a method of formation of a film, said method including the step of depositing a film on a substrate to perform formation of film, wherein formation of film of the film is performed by employing the catalytic CVD equipment according to the foregoing present invention.

A process for production of a solar cell according to the present invention is summarized as a process for production of a solar cell, said process including the step of depositing a film on a substrate to perform formation of film, wherein formation of film of the film is performed by employing the catalytic CVD equipment according to the foregoing present invention.

A substrate holder according to the present invention is summarized as a substrate holder for performing formation of film by supplying a raw material gas to a catalytic wire that is installed and heated in a reaction chamber and then depositing generated decomposed species on a substrate that is held on a holder in the reaction chamber, the holder including an antireflective structure for preventing reflection of a radiant ray that is ejected from the catalytic wire.

According to the present invention, there can be provided a catalytic CVD equipment that is capable of restraining overheating of a substrate and easily controlling a temperature of the substrate in a preferred temperature range. In addition, there can be provided a method for formation of film and a process for production of solar cell, which are capable of providing a deposited film with its good film quality and solar cell with its good solar cell property, by employing the catalytic CVD equipment. Further, there can be provided a substrate holder that is capable of restraining overheating of a substrate in a case where the holder is employed in the catalytic CVD equipment.

BEST MODE FOR CARRYING OUT THE INVENTION

Figure 1:
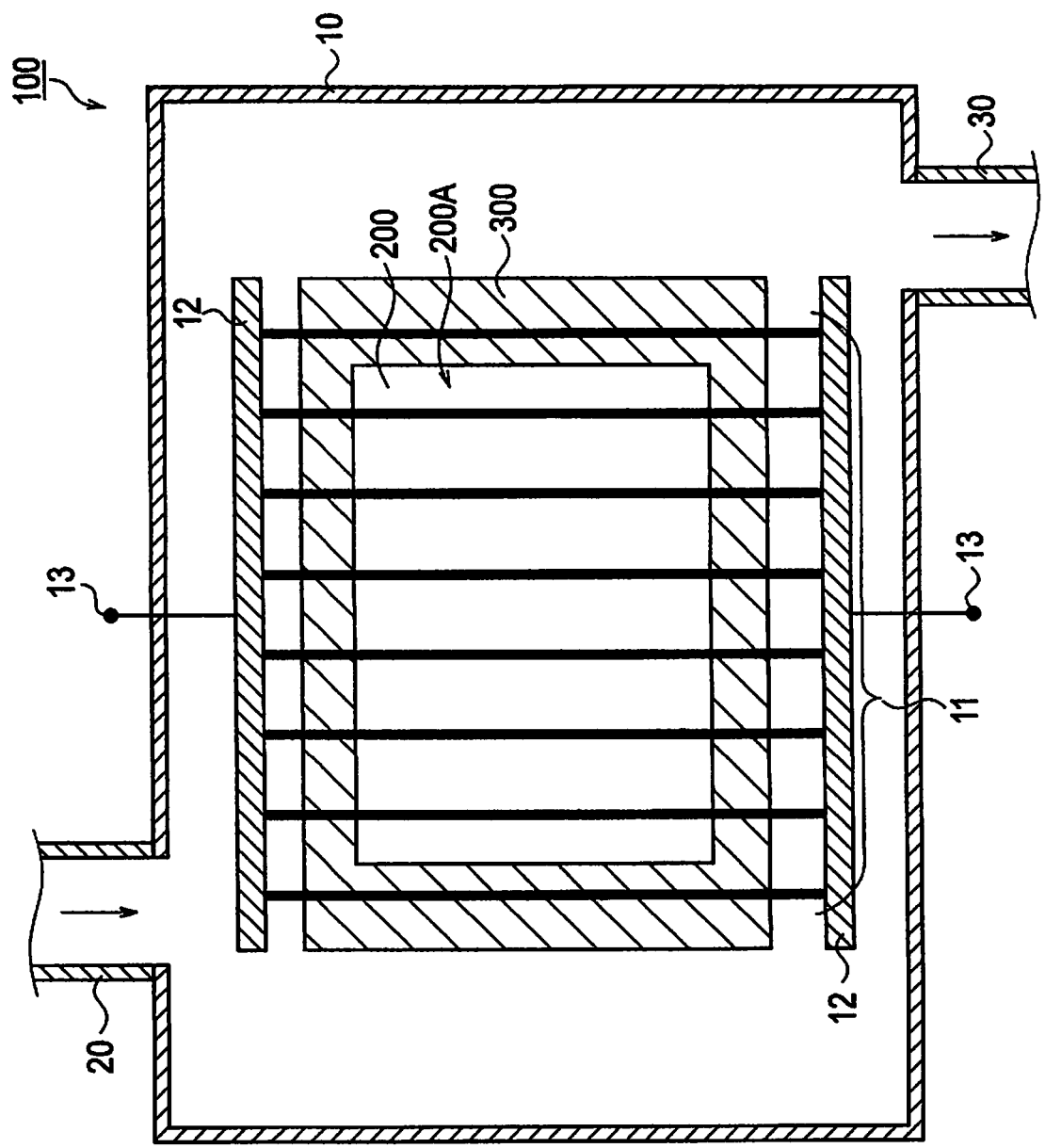
FIG. 1 is a schematic diagram showing a configuration of a catalytic CVD equipment 100 according to an embodiment.

Hereinafter, a catalytic CVD equipment according to an embodiment of the present invention will be described with reference to the drawings. It is to be noted that, in the following description of drawings, the same or similar constituent elements are designated by the same or similar reference numerals.

However, it should be kept in mind that the drawings are schematic, and a rate of each dimension is different from actual one. Therefore, specific dimensions or the like should be determined in consideration of the following description. In addition, it is a matter of course that portions with their different dimensional interrelationships or rates are included in the drawings.

[Configuration of Catalytic CVD Equipment]

Hereinafter, a configuration of a catalytic CVD equipment employed in the embodiment will be described with reference to the drawings. FIG. 1 is a schematic diagram showing a configuration of a catalytic CVD equipment 100. The catalytic CVD equipment 100 is a device that performs formation of film by supplying a raw material gas to a heated catalytic wire which is instated in a reaction chamber, and depositing generated decomposed species onto a substrate held on a holder in the reaction chamber. As shown in FIG. 1, the catalytic CVD equipment 100 is provided with a reaction chamber 10, a gas supply pipe 20, and a gas exhaust pipe 30.

The reaction chamber 10 is provided with a catalytic wire 11 and a mount portion 12. In the reaction chamber 10, a holder 300 for holding a substrate 200 is housed.

The catalytic wire 11 is heated to thereby decompose a raw material gas to be supplied into the reaction chamber 10. Both ends of the catalytic wire 11 are mounted on the mount portion 12, and are disposed perpendicular to a bottom face of the reaction chamber 10. The catalytic wire 11 is disposed so as to be opposed to a holding face whose side is to hold the substrate 200 of the holder 300. While a distance between the catalytic wire 11 and a film-formed face of the substrate 200 is appropriately set, for example, the distance is set on the order of 100 mm to 140 mm. The catalytic wire 11 is electrically powered to be thereby heated to a temperature to an extent such that the raw material gas can be decomposed (for example, 1,600 degrees Centigrade to 2,000 degrees Centigrade). The raw material gas is decomposed by means of the catalytic wire 11 and then the decomposed species reaches the top of a first main face 200A of the substrate 200, whereby a deposited film (such as a semiconductor film or a SiN film, for example) is formed on the substrate 200.

The catalytic wire 11 can be made of a material such as Ta, Mo, or W. In addition, the catalytic wire 11 may have different kinds of layers on surface. One example of such layer includes a tantalum wire of which a borate layer is formed on surface. Further, the catalytic wire 11 whose diameter is 0.3 mm to 2.0 mm, preferably 0.5 mm to 1.0 mm, is employed.

The mount portion 12 is made of a material having its electrical conductivity. A terminal 13 that is electrically connected to the mount portion 12 is connected to a power source, although not shown. As a power source, there can be employed a constant current power source, a constant voltage power source, or constant current/constant voltage power source that is capable of both of constant current control and constant power control.

The gas supply pipe 20 communicates with the reaction chamber 10 and a gas cylinder (not shown) containing a raw material gas (such as $SiH_4$ and $H_2$). The gas supply pipe 20 is a flow path for supplying the raw material gas into the reaction chamber 10.

The gas exhaust pipe 30 is a flow path for discharging the raw material gas from the inside of the reaction chamber 10. In addition, the gas exhaust pipe 30 is capable of discharging the gas that remains in the reaction chamber 10 in order to keep the inside of the reaction chamber 10 in a vacuumed state.

[Configuration of Holder]

Figure 2:
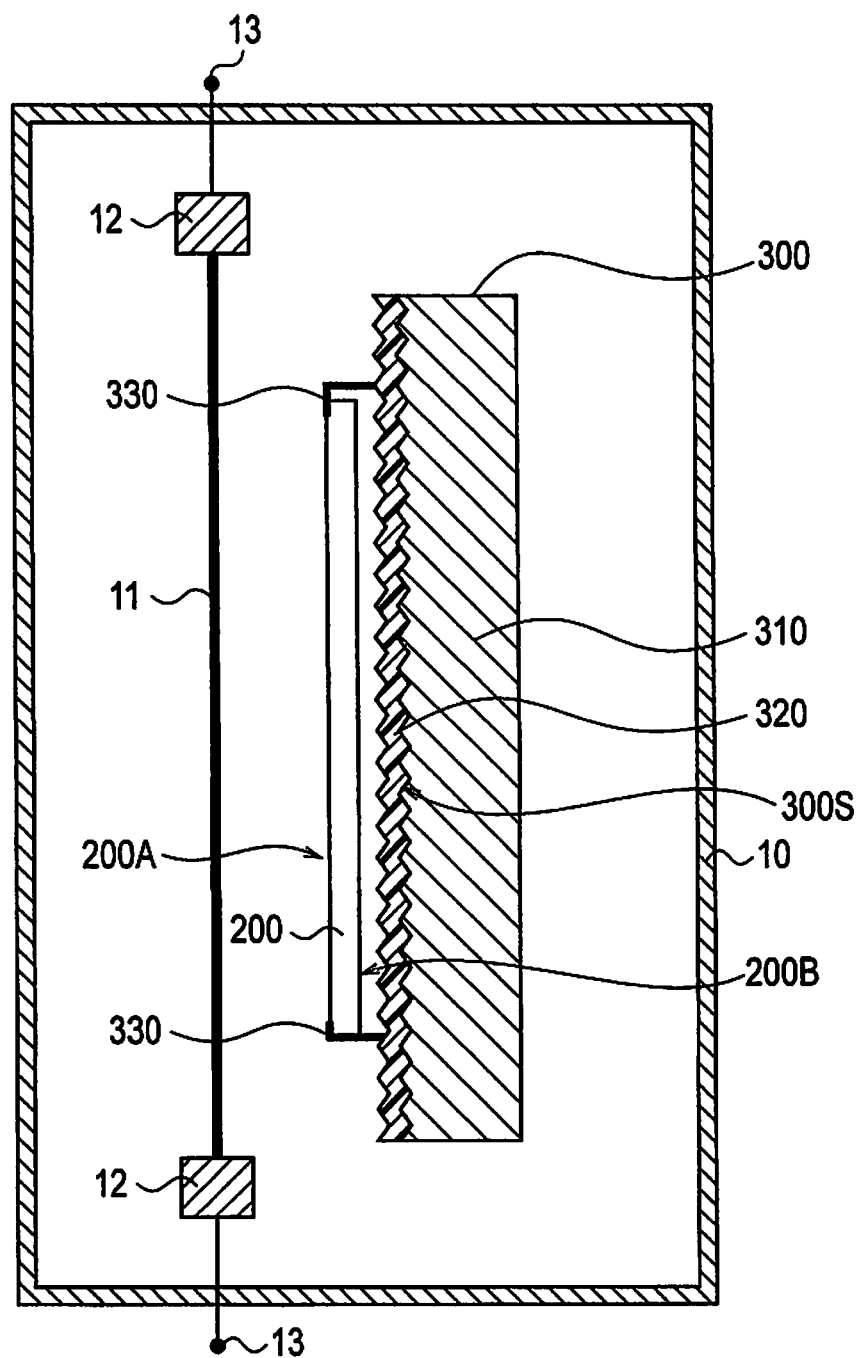
FIG. 2 is a schematic diagram showing a configuration of a holder 300 according to the embodiment.

Next, a configuration of the holder 300 will be described with reference to FIG. 2. FIG. 2 is a side view of the holder 300 that is disposed in the reaction chamber 10.

As shown in FIG. 2, the holder 300 has a holding face 300S, a substrate portion 310, an antireflective film 320, and a holding structure 330.

The substrate portion 310 is a substrate for holding the substrate 200 on the holding face 300S. The substrate 310 can be made of a metal material with its good thermal conductivity such as aluminum or stainless steel.

The substrate 200 is a substrate on which a deposited film is to be formed. The substrate 200 is formed in a plate-like shape, for example, and has: a first main face 200A on which a deposited film is to be formed; and a second main face 200B that is provided at the opposite side of the first main face 200A. As shown in FIG. 2, the second main face 200B of the substrate 200 is opposed to the holding face 300S.

Here, a concave-convex structure is formed on the holding face 300S. The size of the concave-convex structure is on the order of 2 microns to 5 microns in height and on the order of 2 microns to 5 microns in pitches, for example. Such a concave-convex structure can be formed by applying blast treatment to the holding face 300S, for example.

Although the concave-convex structure may be formed in a substantially full area of the holding face 300S, it is preferable that the structure be formed in at least an area that is opposite to the second main face 200B of the substrate 200 of the holding face 300S.

The holding structure 330 is mounted on the substrate portion 310. It is sufficient if the holding structure 330 hold the substrate 200 on the holding face 300S, for example, a configuration of a substrate press mask and a mask mount member can be employed. The holding structure 330 may be detachable from the substrate portion 310.

The antireflective film 320 is formed on the holding face 300S. In the embodiment, the antireflective film 320 covers a concave-convex structure that is formed on the holding face 300S. The antireflective film 320 reduces reflection of a radiant ray toward the side of the substrate 200 due to the substrate portion 310 by performing absorption or the like of the radiant ray that is ejected from the catalytic wire 11 and then passes through the substrate 200 (such as an infrared ray or a visible ray, for example).

In addition, the antireflective film 320 can be made of a silicon-containing film that contains silicon. According to such a silicon-containing film, a radiant ray permeating through the substrate 200 can be absorbed, thus making it possible to reduce reflection of the radiant ray toward the side of the substrate 200 by means of the substrate portion 310.

Figure 3:
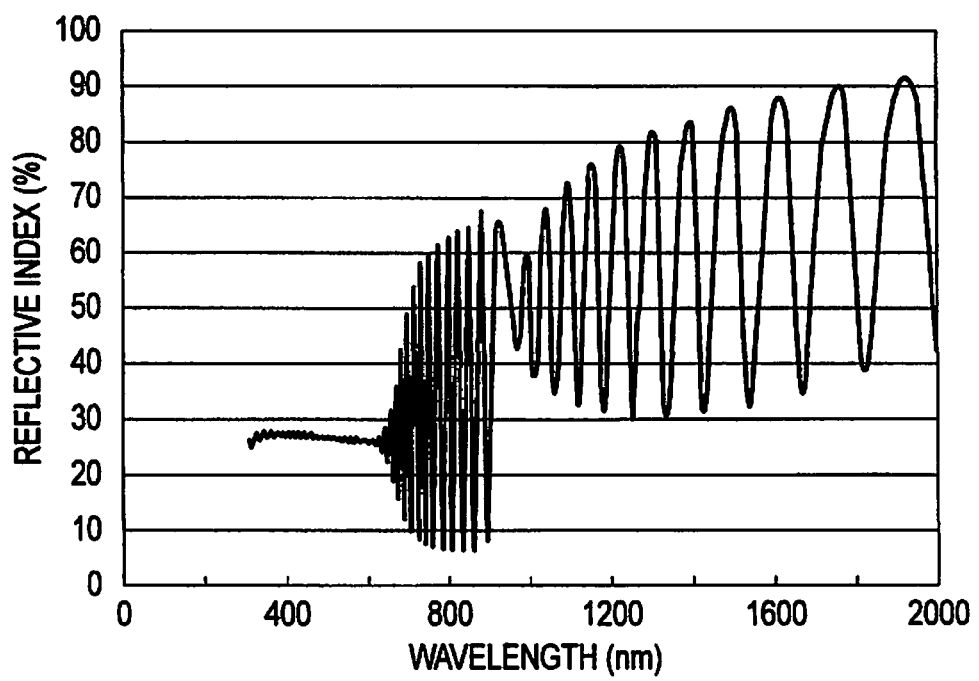
FIG. 3 is a view showing a reflective index of a sample 1 according to the embodiment.
Figure 4:
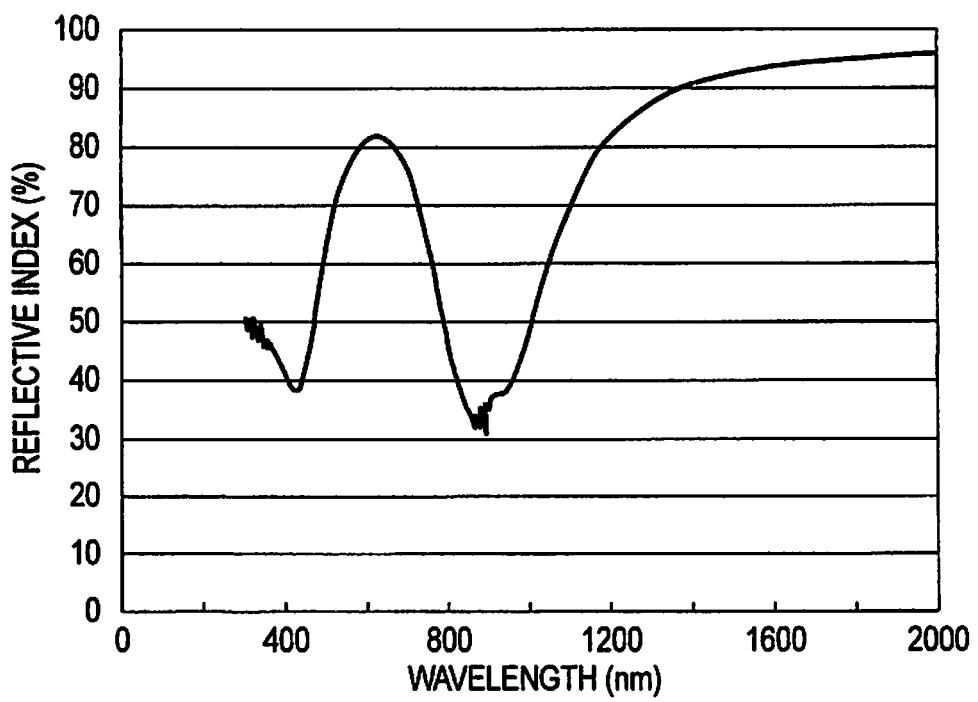
FIG. 4 is a view showing a reflective index of a sample 2 according to the embodiment.
Figure 5:
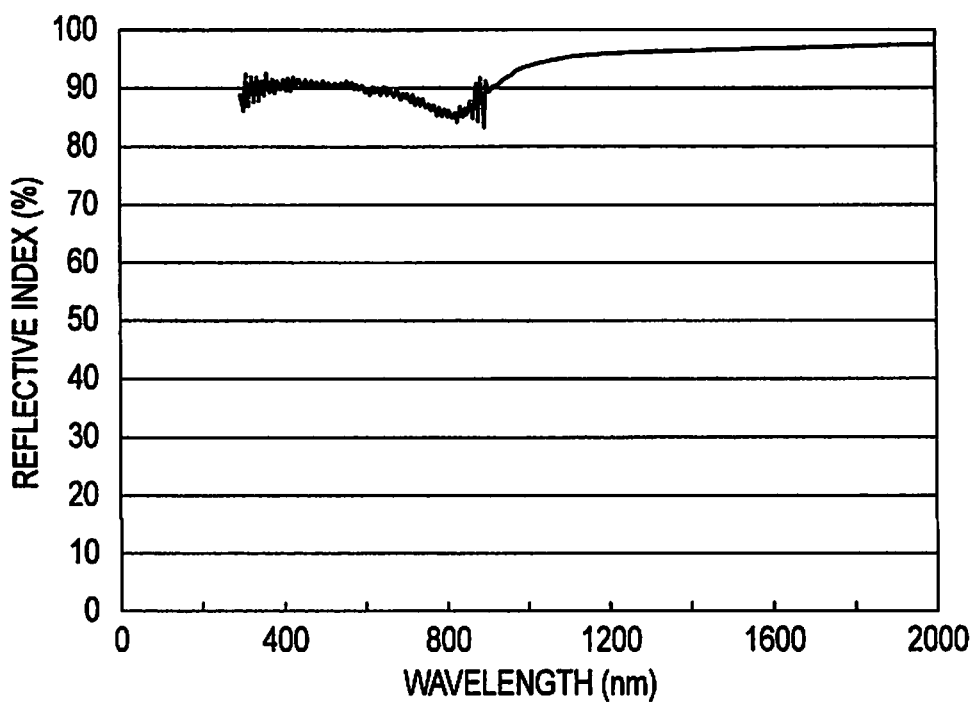
FIG. 5 is a view showing a reflective index of a sample 3 according to the embodiment.

FIG. 3 is a view showing a reflective index of a sample 1 that is fabricated by forming an amorphous silicon film with its thickness of 3 microns on an aluminum film with its thickness of 250 nm, the aluminum film being formed on a glass substrate, by employing a plasma CVD technique. FIG. 4 is a view showing a reflective index of a sample 2 fabricated by forming an amorphous silicon film having a thickness less than the thickness of the sample 1 on an aluminum film with its thickness of 250 nm, the aluminum film being formed on a glass substrate, by employing a plasma CVD technique. FIG. 5 is a view showing a reflective index of a sample 3 without an amorphous silicon film, the sample being fabricated by forming an aluminum film with its thickness of 250 nm on a glass substrate. From these figures, it is found that the reflective index of each of the samples 1 and 2 with an amorphous silicon film is smaller than that of the sample 3 without an amorphous silicon film.

It is to be noted that, as a silicon-containing film, there can be employed a film substantially entirely containing an amorphous structure as seen in amorphous silicon film or a film partially containing a crystalline structure as seen in finely crystalline silicon film. Alternatively, the silicon-containing film may substantially entirely contain a crystalline structure. In addition, as a material of silicon-containing film, there can be employed the one containing a silicon alloy such as silicon germanium or silicon carbide without being limitative to silicon. Further, a silicon-containing film may or may not contain impurities for valence electron control. While such a silicon-containing film can be formed by means of a catalytic CVD technique, a plasma CVD technique, or a vacuum vapor deposition technique, the abovementioned catalytic CVD equipment 100 can be employed; and therefore, the catalytic CVD technique is preferable in particular. It is sufficient if the antireflective film 320 have a thickness of about 1.5 microns to 3 microns, for example.

In addition, the antireflective film 320 can be formed by employing a mixed crystal film such as alumina, titania, and chrome oxide. According to the antireflective film 320 employing such a mixed crystal film, the radiant ray that permeates through the substrate 200 is scattered on a crystalline interface, thus making it possible to change an incident angle of the radiant ray to the antireflective film 320. Therefore, the radiant ray that permeates through the substrate 200 can be confined in the antireflective film 320, thus making it possible to reduce reflection of the radiant ray toward the side of the substrate 200. It is to be noted that such mixed crystal film can be fabricated by means of a variety of methods such as vapor deposition technique, plasma thermal spraying technique or reactive sputtering technique. For example, by employing the vapor deposition technique, aluminum that is housed in melting pot is heated and evaporated in an oxygen atmosphere, whereby a mixed crystal film of alumina can be formed. In addition, by employing the plasma thermal spraying technique, oxygen is employed as an activation gas, a plasma jet with its high temperature and high speed exceeding 10,000 degrees Centigrade is generated between an anode and a cathode by means of direct current arc discharge, aluminum powder is entered into the plasma jet, melting and acceleration is performed, and a film is formed, whereby a mixed crystal film of alumina can be formed. Alternatively, by employing the reactive sputtering technique, oxygen is introduced at the time of sputtering employing an aluminum target, whereby a mixed crystal film of alumina can be formed. Further, by employing such a mixed crystal film, even in a case of employing the holder 300 on which an amorphous silicon film cannot be formed, the antireflective film 320 can be formed on the holding face 300S.

Although the antireflective film 320 may be formed in a substantially full area of the holding face 300S, it is preferable that the film be formed in at least an area that is opposite to the second main face 200B of the holding face 300S.

Herein, the antireflective film 320 that is formed on the holding face 300S is provided as one example of an "antireflective structure" according to the present invention. The "antireflective structure" used here denotes a structure for preventing reflection toward the side of the substrate 200 by means of the substrate portion 310 of the radiant ray that is ejected from the catalytic wire 11 and permeates through the substrate 200.

[Functions and Advantageous Effects]

In the catalytic CVD equipment 100 according to the embodiment, the holder 300 has the antireflective film 320 as an antireflective structure for preventing reflection toward the side of the substrate 200 by means of the substrate portion 310 of the radiant ray that is ejected from the catalytic wire 11.

Therefore, in a case where a deposited film is formed on the first main face 200A of the substrate 200, reflection of the radiant ray (such as an infrared ray or a visible ray, for example) that is ejected from the catalytic wire 11 and permeates through the substrate 200 is reduced by means of the antireflective film 320, and part of the energy of the radiant ray is transmitted as a heat to the substrate portion 310 with its good thermal conductivity. Thus, the substrate 200 is restrained from being overheated, and a temperature of the substrate 200 is easily controlled in a preferred temperature range, thus making it possible to form a deposited film having its good film quality. Accordingly, a deposited film is formed by employing such a holder 300, thereby making it possible to obtain its good film property.

In addition, in the embodiment, the antireflective structure has a concave-convex structure that is formed on the holding face 300S. In this case, an optical path length in the antireflective film 320 of the radiant ray that is reflected on the holding face 300S can be increased, thus making it possible to absorb or confine the radiant ray more effectively. As a result, overheat of the substrate 200 can be restrained more significantly.

Further, adhesion between the holding face 300S and the antireflective film 320 can be improved, thus making it possible to restrain release of the antireflective film 320 from the holding face 300S.

Other Embodiments

While the present invention was described by way of the foregoing embodiment, it should not be understood that the statements and drawings forming part of this disclosure limit this invention. From this disclosure, a variety of substitute embodiments, examples, and operating techniques would have been self-evident to one skilled in the art.

Figure 6:
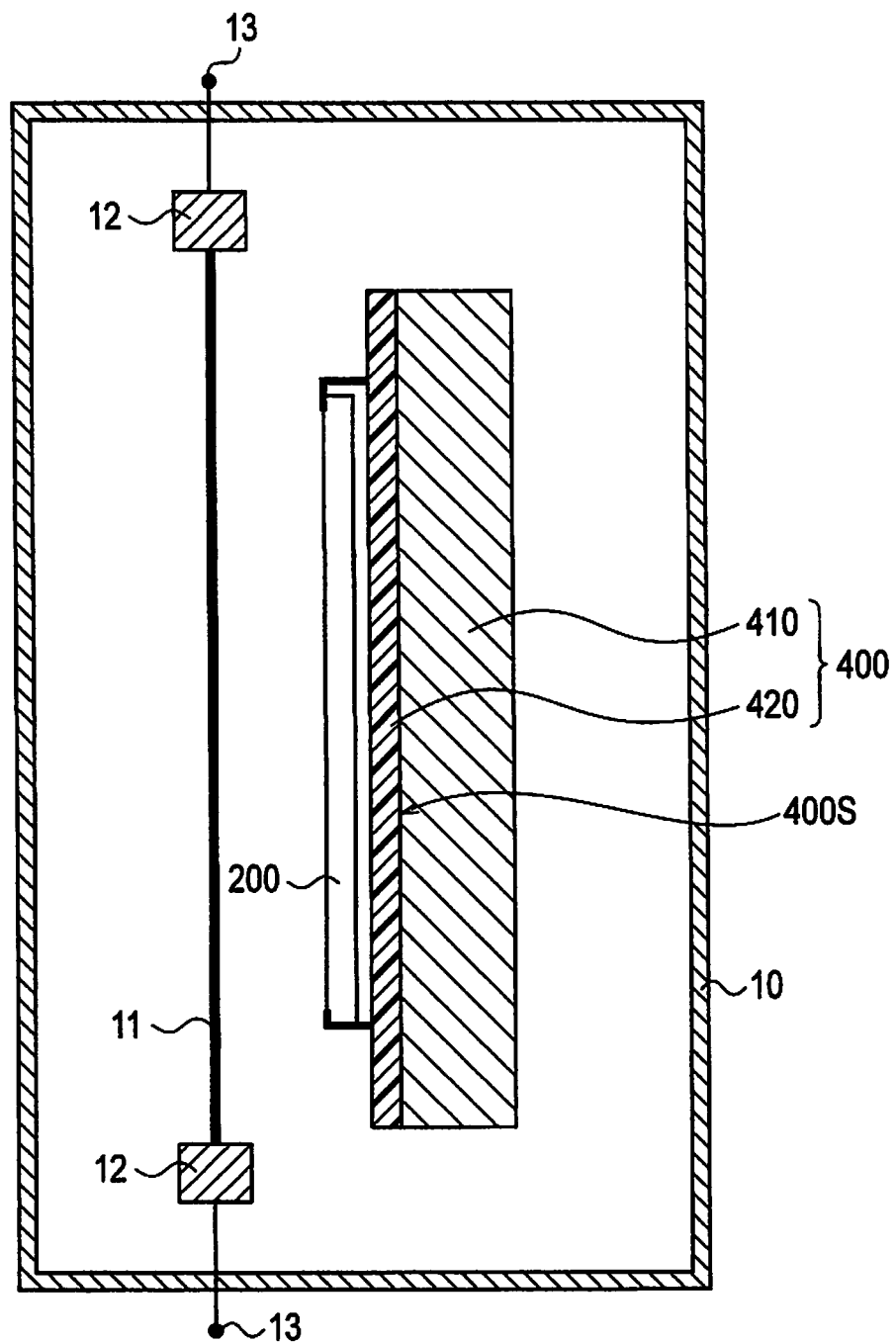
FIG. 6 is a schematic diagram showing a configuration of a holder 400 according to the embodiment.

For example, while, in the foregoing embodiment, a concave-convex structure was formed on the holding face 300S, such concavities and convexities may not be formed. That is, as shown in FIG. 6, there may be employed a holder 400 in which an antireflective film 420 is formed on a flat holding face 400S of a substrate portion 410.

In addition, while, in the foregoing embodiment, the antireflective structure of the holder 300 was formed by means of the antireflective film 320 this structure is not limitative thereto. For example, in the antireflective structure, the holder 300 may be a structure having an opening that is formed in an area that is opposite to the second main face 200B, that is, in an area that is opposite to the catalytic wire 11 while the substrate 200 is sandwiched therebetween. In this case, the radiant ray that is ejected from the catalytic wire 11 and permeates through the substrate 200 passes through an opening of the holder 300; and therefore, the radiant ray that is reflected by means of the holder 300 can be reduced.

Further, while, in the foregoing embodiment, the antireflective structure was formed integrally with the holder 300, this structure is not limitative thereto. For example, the antireflective structure may be a structure that is formed independently of the holder 300, and this structure may be mounted to the holder 300.

Furthermore, although not specifically mentioned in the foregoing embodiment, the catalytic CVD equipment 100 and the holder 300, according to the present invention, can be employed to form a film other than a semiconductor film such as an amorphous Si film or a semiconductor film such as a SiN film. Moreover, the catalytic CVD equipment 100 and the holder 300 can be employed in a process of production of semiconductor devices such as solar cells that are provided with at least one of a semiconductor film and another non-semiconductor film. Thus, by employing the catalytic CVD equipment 100 or the holder 300 according to the present invention, the substrate 200 is restrained from being overheated, and a temperature of the substrate 200 can be controlled in a preferred temperature range, thus making it possible to produce a film or a solar cell having its good property.

Still furthermore, while, in the foregoing embodiment, the catalytic CVD equipment 100 was arranged so as to be provided with only one reaction chamber 10, this device is not limitative thereto. The catalytic CVD equipment 100 may be provided with a plurality of reaction chambers. In this manner, films of a same kind or films of different kinds can be formed to be superimposed on the substrate 200.

EXAMPLES

While Examples of the holder according to the present invention will be specifically described hereinafter, the present invention is not limitative to the descriptive matter set forth in the following Examples, and the present invention can be appropriately modified and carried out without departing from the spirit and scope of the invention.

Preparation of Holder (1) Example 1

As a holder according to Example 1, an aluminum plate was prepared, the plate having a flat holding face and an amorphous silicon layer with its thickness of about 2 microns, the layer being formed on the holding face by means of a catalytic CVD technique.

(2) Example 2

As a holder according to Example 2, an aluminum plate was prepared, the plate having a holding face on which a concave-convex structure is formed and an amorphous silicon layer with its thickness of about 2 microns, the layer being formed on the holding face by means of the catalytic CVD technique, was prepared.

(3) Example 3

As a holder according to Example 3, an aluminum plate was prepared, the plate having a flat holding face and an amorphous silicon layer with its thickness of about 1 micron, the layer being formed on the holding face by means of a catalytic CVD technique, was prepared.

(4) Comparative Example

As a holder according to Comparative Example, an aluminum plate having a flat holding face was prepared.

Comparative Experiments (1) Experiment 1

First, silicon plates were held as substrates on the respective holders in Example 1 and Comparative Example.

Next, each of the holders was transported into a reaction chamber in which a catalytic wire was arranged, and the substrate and the catalytic wire were disposed so as to be opposed to each other.

Next, the catalytic wire was heated up to the order of 1,600 degrees Centigrade to 2,000 degrees Centigrade, and thereafter, in this state, the heated catalytic wire was left as is, for 300 seconds.

Next, when surface temperatures of the substrates were measured, the measured surface temperature of the substrate that was held on the holder of Example 1 was 300 degrees Centigrade, whereas the measured surface temperature of the substrate that was held on the holder of Comparative Example was about 400 degrees Centigrade.

It is deemed that a reason why such a result was obtained is that, in the holder of Example 1, reflection of the radiant ray permeating through the substrate and hitting against the holder toward the side of the substrate could be restrained by means of the antireflective structure included in the holder.

(2) Experiment 2

First, silicon plates were held as substrates on the respective the holders in Example 2, Comparative Example, and Example 3.

Next, each of the holders was transported in a reaction chamber in which a catalytic wire was arranged, and the substrate and the catalytic wire were disposed so as to be opposed to each other.

Figure 7:
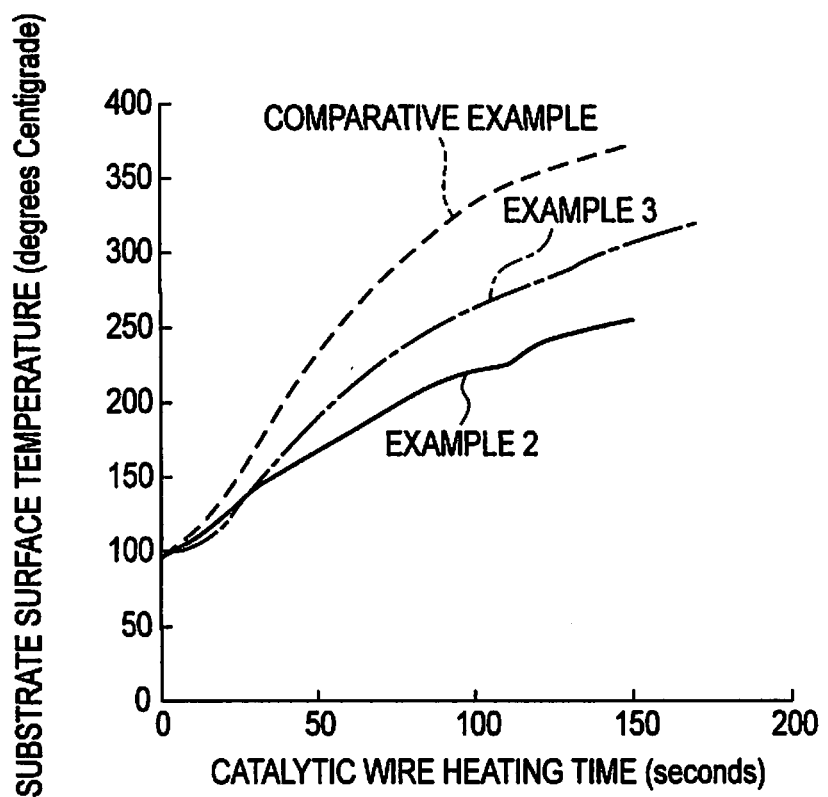
FIG. 7 is a graph depicting a change of each of the surface temperatures of substrates that are held on holders of Example 2, Example 3, and Comparative Example.

Next, a change in the surface temperature of the substrate was measured while the catalytic wire was heated up to the order of 1,600 degrees Centigrade to 2,000 degrees Centigrade. FIG. 7 is a graph depicting a change in each of the surface temperatures of the substrates that are held on the holders in Example 2, Example 3, and Comparative Example.

As shown in FIG. 7, it was found that the surface temperatures of the substrates that were held on the holders in Example 2 and Example 3 are gently increased in comparison with the surface temperature of the substrate that was held on the holder in Comparative Example.

It is deemed that a reason why such a result was obtained is that, in the holders of Example 2 and Example 3, reflection of the radiant ray that permeates through the substrate and hits against the holders toward the side of the substrate could be restrained by means of the antireflective structure included in the holders.

In addition, it was found that the surface temperature of the substrate that was held on the holder in Example 2 is gently increased in comparison with the surface temperature of the substrate that was held on the holder in Example 3.

It is deemed that a reason for this finding is that the holder in Example 2 has an amorphous silicon layer with its greater thickness in comparison with that of the holder in Example 3, and that a concave-convex structure is formed on a holding face, whereby reflection of the radiant ray ejected from the catalytic wire on the holding face could be restrained more effectively.

From the foregoing, overheat of the substrate temperature can be restrained according to the present invention; and therefore, it was found that the substrate temperature can be controlled in an appropriate temperature range. In addition, it is deemed that a deposited film with its good film quality and a solar cell with its good solar cell property can be produced by employing the present invention.

It is to be noted that the entire contents of Japanese Patent Application No. 2009-230589 (filed on Oct. 2, 2009) are incorporated in the present specification by reference.

INDUSTRIAL APPLICABILITY

As described above, a catalytic CVD equipment according to the present invention is capable of restraining overheating of a substrate, and is capable of controlling a temperature of the substrate in a preferred temperature range; and therefore, this device is useful in the field of forming a film such as the field of production of solar cell. In addition, a method for formation of film and a process for production of solar cell, according to the present invention, are capable of providing a deposited film with its good film quality and a solar cell with its good solar cell property; and therefore, the method and process are useful in the field of production of solar cell. Further, a substrate holder according to the present invention is useful in the field of production of solar cell, since overheat of the substrate is restrained.

DESCRIPTION OF REFERENCE NUMERALS

10 . . . Reaction chamber
11 . . . Catalytic wire
12 . . . Mount portion
13 . . . Terminal
20 . . . Gas supply pipe
30 . . . Gas exhaust pipe
100 . . . Catalytic CVD equipment
200 . . . Substrate
200A . . . First main face
200B . . . Second main face
300 . . . Holder
300S . . . Holding face
310 . . . Substrate portion
320 . . . Antireflective film
330 . . . Holding structure
400 . . . Holder
400S . . . Holding face
410 . . . Substrate portion
420 . . . Antireflective film

The invention claimed is:

1. A catalytic CVD equipment for performing formation of film by supplying a raw material gas to a catalytic wire that is installed and heated in a reaction chamber and then depositing generated decomposed species on a substrate that is held on a holder in the reaction chamber,
   the holder including an antireflective structure for preventing reflection of a radiant ray that is ejected from the catalytic wire,
   wherein the antireflective structure includes an antireflective film having a thickness of about 1.5 microns to 3 microns and has a concave-convex structure that is provided so as to be opposed to the substrate,
   wherein the antireflective film is provided on a surface of the holder facing a back surface of the substrate, and
   wherein the holder has a substrate portion on which the antireflective film is formed, and the substrate portion is made of aluminum or stainless steel.

2. The catalytic CVD equipment according to claim 1, wherein the antireflective film includes a silicon-containing film.

3. The catalytic CVD equipment according to claim 2, wherein the silicon-containing film has at least one structure of the group consisting of an amorphous structure and a crystalline structure.

4. The catalytic CVD equipment according to claim 1, wherein the antireflective film includes a mixed crystal film.

5. A method of formation of a film using a catalytic CVD equipment according to claim 1, said method including the step of depositing a film on a substrate to perform formation of film, wherein formation of film of the film is performed by employing the catalytic CVD equipment.

6. A process for production of a solar cell using a catalytic CVD equipment according to claim 1, said process including the step of depositing a film on a substrate to perform formation of film,
   wherein formation of film of the film is performed by employing the catalytic CVD equipment.

7. A catalytic CVD equipment for performing formation of film by supplying a raw material gas to a catalytic wire that is installed and heated in a reaction chamber and then depositing generated decomposed species on a substrate that is held on a holder in the reaction chamber,
   the holder including an antireflective film comprising a silicon-containing film that is formed on a holding face for holding the substrate,
   wherein the antireflective structure prevents reflection of a radiant ray that is ejected from the catalytic wire, and has a concave-convex structure that is provided so as to be opposed to the substrate,
   wherein the silicon-containing film has a thickness of about 1.5 microns to 3 microns,
   wherein the silicon-containing film is provided on a surface of the holder facing a back surface of the substrate, and
   wherein the holder has a substrate portion on which the antireflective film is formed, and the substrate portion is made of aluminum or stainless steel.

8. A substrate holder for performing formation of film by supplying a raw material gas to a catalytic wire that is installed and heated in a reaction chamber and then depositing generated decomposed species on a substrate that is held on a holder in the reaction chamber,
   the holder including an antireflective structure for preventing reflection of a radiant ray that is ejected from the catalytic wire,
   wherein the antireflective structure includes an antireflective film having a thickness of about 1.5 microns to 3 microns and has a concave-convex structure that is provided so as to be opposed to the substrate,
   wherein the antireflective film is provided on a surface of the holder facing a back surface of the substrate, and wherein the holder has a substrate portion on which the antireflective film is formed, and the substrate portion is made of aluminum or stainless steel.

* * * * *